(12) United States Patent
Gales et al.

(10) Patent No.: US 6,779,262 B1
(45) Date of Patent: Aug. 24, 2004

(54) METHOD FOR MANUFACTURING A MULTILAYER PRINTED CIRCUIT BOARD

(75) Inventors: Raymond Gales, Harlange (LU); Damien Michel, Bromont (CA)

(73) Assignee: Circuit Foil Luxembourg Trading Sarl, Luxembourg (LU)

( * ) Notice: Subject to any disclaimer, the term of this patent is extended or adjusted under 35 U.S.C. 154(b) by 0 days.

(21) Appl. No.: 09/937,085

(22) PCT Filed: Mar. 23, 2000

(86) PCT No.: PCT/EP00/02560

§ 371 (c)(1),
(2), (4) Date: Jan. 17, 2002

(87) PCT Pub. No.: WO00/57680

PCT Pub. Date: Sep. 28, 2000

(30) Foreign Application Priority Data

Mar. 23, 1999 (LU) ................................. 90376
Nov. 19, 1999 (LU) ................................. 90475

(51) Int. Cl.$^7$ .............................................. H01K 3/10
(52) U.S. Cl. .......................... 29/852; 29/830; 29/846; 427/97; 174/215; 174/261
(58) Field of Search .................... 29/852, 830, 846; 427/97; 216/17, 20; 174/255, 261, 262, 265, 266

(56) References Cited

U.S. PATENT DOCUMENTS

| | | | |
|---|---|---|---|
| 3,674,656 A | | 7/1972 | Yates |
| 3,998,601 A | * | 12/1976 | Yates et al. ................... 428/607 |
| 4,088,544 A | * | 5/1978 | Hutkin ........................ 428/545 |
| 4,398,993 A | | 8/1983 | Hume, Jr. et al. |
| 4,489,154 A | * | 12/1984 | Taylor, Jr. .................... 430/253 |
| 6,240,636 B1 | * | 6/2001 | Asai et al. ..................... 29/852 |

FOREIGN PATENT DOCUMENTS

| | | |
|---|---|---|
| DE | 3103986 A1 | 9/1982 |
| EP | 0935407 A1 | 8/1999 |
| JP | 9-36550 | 2/1997 |
| JP | 10075069 | 3/1998 |
| JP | 10190236 | 7/1998 |
| JP | 10-224040 | 8/1998 |
| JP | 10-321977 | 12/1998 |
| WO | WO 97/41713 | 11/1997 |

OTHER PUBLICATIONS

"Laser Drilling of Microvias in Epoxy–Glass Printed Circuit Boards" by A. Kestenbaum, et al.—8091 IEEE Transactions on Components, Hybrids and Manufacturing Technology, vol. 13, No. 4, Dec. 1990, New York, US.

(List continued on next page.)

Primary Examiner—Carl J. Arbes
Assistant Examiner—Tim Phan
(74) Attorney, Agent, or Firm—McCormick, Paulding & Huber LLP

(57) ABSTRACT

A method for manufacturing a multilayer printed circuit board includes providing a core board, a composite foil including a carrier foil, a functional copper foil and a non-reinforced thermosetting resin layer, the functional copper foil being electro-deposited with a uniform thickness of more than 4 μm but less than 10 μm on the carrier foil, the functional copper foil having a front side facing the carrier foil and an opposite backside which is coated with the non-reinforced thermosetting resin layer. The method further involves laminating the composite foil with the non-reinforced thermosetting resin layer on the core board and removing the carrier foil from the functional copper foil in order to uncover the front side of the functional copper foil. A $CO_2$ laser source drills holes from the uncovered front side of the functional copper foil through the functional copper foil and the non-reinforced thermosetting resin layer to form microvias.

22 Claims, 2 Drawing Sheets

OTHER PUBLICATIONS

"Formation of Microvias in Epoxy–Glass Composites by Laser Ablation" by . A. N. Pargellis, et al.—1012 Optics & Laser Technology, vol. 22, No. 3, Jun. 1990, Guildford, Surrey, GB.

"CO2 Laser Drilling of Copper Following Excimer Laser Pretreatment" by G. Kinsman and W.W. Duley, –Appl. Phys. Lett 56 (11), Mar. 12, 1990.

"Enhancing the um Absorptivity of Copper and Aluminum Using Excimer Laser Radiation" by G. Kinsman and W.W. Duley, –Appl. Phys. Lett. 54 (1), Jan. 2, 1989.

* cited by examiner

METHOD FOR MANUFACTURING A MULTILAYER PRINTED CIRCUIT BOARD

CROSS-REFERENCE TO RELATED APPLICATIONS

This application is entitled to the benefit of and incorporates by reference in their entireties essential subject matter disclosed in International Application No. PCT/EP00/02560 filed on Mar. 23, 2000, Luxembourg Patent Application No. 90 376 filed on Mar. 23, 1999 and Luxembourg Patent Application No. 90 475 filed on Nov. 19, 1999.

FIELD OF THE INVENTION

The present invention generally relates to the manufacturing of a multilayer printed circuit board and to a composite foil for use therein.

BACKGROUND OF THE INVENTION

The development of very compact and powerful electronic devices has been possible thanks to high-density printed circuit boards (PCB), obtained by sequential build-up (SBU) technology. Basically, a build-up multilayer circuit is a combination of several superimposed layers of different wiring densities, which are separated by dielectric layers and interconnected through micro blind vias with diameters of generally less than 100 $\mu$m.

Nowadays, essentially three different technologies are available for the manufacture of microvias: (1) the photochemical etching of photodielectrics; (2) the plasma etching process; and (3) the still relatively new process of laser drilling. Laser drilling seems to be the most promising technology for the production of microvias. Excimer, Nd-YAG and $CO_2$ laser sources are currently used for drilling of microvias, but each of these laser sources still has its specific draw-backs. Excimer lasers are not considered economically viable for industrial use. They have a low ablation rate per pulse and involve high investments in safety precautions, as excimer laser gases are extremely corrosive and highly toxic. Nd-YAG lasers are successfully used for smaller and medium sized volumes of high end products with microvias of diameters from 25 to about 75 $\mu$m. Larger holes must be produced by trepanning (i.e. by drilling multiple smaller holes), which of course reduces drilling speeds considerably. $CO_2$ lasers are increasingly gaining ground vis-à-vis the Nd-YAG laser for a large volume production of microvias. They are characterised by an ablation rate in non-reinforced polymer that is about twenty times as high as for Excimer or Nd-YAG lasers.

However, if $CO_2$ lasers are very much adapted for polymer ablation, they are not suitable for copper removal. Hence, an additional process step, the manufacturing of a conformal mask, is necessary before a hole can be produced in the dielectric layer with the $CO_2$ laser. During this additional step, openings are etched in the copper laminate at the positions where the dielectric should be removed later. This method allows to use the $CO_2$ laser for drilling blind microvias, but the manufacturing process is slowed by the conformal mask building step and there is a real risk of damaging the copper layer during the conformal mask building.

In order to avoid the above and other disadvantages of the conformal mask technology, it has been suggested to use a twin laser device for drilling the holes. Such a twin laser device is a combination of $CO_2$ laser source with an IR solid-state laser. First, the opening in the copper foil is carried out with the solid-state laser. The resin layer is then removed with the $CO_2$ laser. Such a twin laser allows microvia drilling in copper cladded build-ups, but the investment cost is higher than for a simple $CO_2$ laser, and the slow copper drilling step is responsible for a low process speed.

It has also been suggested to replace the manufacture of the conformal mask by a "half etching" step. A thin resin coated copper foil of about 18 $\mu$m is first laminated on the core board, with its copper foil upside. After lamination, the 18 $\mu$m copper foil is etched over its entire surface, in order to reduce its thickness down to about 5 $\mu$m. In the next step, the copper layer undergoes a black oxide treatment, to form a laser drilling adapted surface. Then, the $CO_2$ laser is used to drill the microvias directly through the 5 $\mu$m copper layer and the subjacent resin layer. The "half etching" step is of course less complex than conformal mask building, but the manufacturing process is nevertheless slowed down by the half etching step and the copper surface might still be damaged during the half etching step. Furthermore, $CO_2$ laser drilling on "half etched" copper foils does not yet produce satisfying results. The poor results are due to the fact, that etching the entire surface of e.g. a 600 mm×500 mm printed circuit board is neither a homogeneous, nor a precise operation. The most recent etching agents and etching machines claim a tolerance of ±2 $\mu$m. The thickness of a copper foil etched down to a nominal thickness of 5 $\mu$m may therefor vary from 3 $\mu$m to 7 $\mu$m. When drilling the microvias, the laser energy is set for a nominal copper thickness of 5 $\mu$m. If the copper layer at the incidence point is only 3 $\mu$m, the set laser energy is too high for the amount of copper to be vaporised. As a result, copper splashes are created on the border of the hole and the hole in the dielectric material is generally misshaped. If the copper layer at the incidence point is however 7 $\mu$m, the set laser energy is too low and the resulting hole in the dielectric material will have too small a diameter or will even not extend to the subjacent copper layer. Due to the disappointing results of the half etching method, $CO_2$ laser drilling is still exclusively used on non-copper cladded build-up materials or with conformal mask etching.

SUMMARY OF THE INVENTION

U.S. Pat. No. 3,998,601 discloses a composite foil and a method for manufacturing the latter. The composite foil comprises an electrodeposited copper support layer and a second electrodeposited copper layer of a thickness which is not self supporting. Intermediate the copper support layer and the second copper layer is a thin layer of a release agent, preferably chromium. The second copper layer has a thickness no greater than 12 $\mu$m. A laminate may be formed by superimposing this composite foil on epoxy impregnated fiberglass with the ultrathin copper surface in contact with the epoxy-glass substrate, and subjecting this assembly to a conventional laminating process. After cooling of the laminate, the copper carrier coated with the release agent is peeled away to produce a thin copper clad laminate suitable for etching, etc. in the production of printed circuit elements.

A method for manufacturing a multi-layer interconnected board is described in JP 10 190236. According to a first step of this method, a circuit board with a desired circuit pattern formed thereon, a metal foil and an insulator layer are positioned, stacked up and laminated. In the next step, a point on a conductor layer desired to be laser processed is subjected to a process to increase the rate of absorption of the laser. In the following step a laser beam is impinged on the processed point so as to melt and sublime the metal foil and the insulator layer and thereby form a hole. In a final step, electroless plating is performed to electrically connect conductors through the hole.

The possibility of laser drilling into copper clad epoxy-glass, in particular by means of a CO2 laser, is reported in "Laser drilling of microvias in epoxy-glass printed circuit boards" by A. Kestenbaum et al., IEEE Transactions on components, hybrids and manufacturing technology, vol.13, no. 4, Dec. 1990 (1990-12), pages 1055–1062, XP000176849 IEEE Inc. New York, US ISSN: 0148-6411. In one of the experiments, a $CO_2$ laser was used to drill a through hole in a 0.254 mm (10-mil) epoxy-glass layer clad with 4.4 μm (⅛-oz) copper on both sides. In another experiment a $CO_2$ laser was used to drill a blind hole in a 0.254 mm (10-mil) epoxy-glass layer clad with 4.4 μm (⅛-oz) copper.

DE-A-31 03 986 relates to a process for the production of drilled holes for the throughplating in printed circuit boards consisting of substrate materials on the basis of carbon. The throughholes are drilled using a CO2 laser. The metal layer on top of the printed circuit board may be coated with a radiation-specific acceptor to improve the absorption of the laser beam. In case the metal layer is made of copper, the acceptor may be made of Copper-II-oxide.

Consequently, there is a strong need for a simple and efficient method for the manufacture of multilayer printed circuit boards, which allows fast laser drilling of high-quality microvias.

Another object of the present invention is to provide a composite foil, which allows fast laser drilling of high-quality microvias, when it is used in the manufacture of multilayer printed circuit boards.

In accordance with the present invention, a method for manufacturing a multilayer printed circuit board comprises the following steps:

a) providing a core board;
b) providing a composite foil including a functional copper foil of less than 10 μm mounted on a carrier foil, said copper foil having a front side facing said carrier foil and a back side coated with a non-reinforced thermosetting resin;
c) laminating said composite foil with the resin coated back side on one side of said core board;
d) removing said carrier foil from said functional copper foil, in order to uncover said front side of said functional copper foil;
e) drilling holes through said functional copper foil and said resin in order to form microvias.

According to an important aspect of the present invention, the functional copper foil of the composite foil has a thickness of less than 10 μm, preferably of about 5 μm, whereby it becomes possible to use a $CO_2$ laser source to drill microvias directly from the uncovered front side through the very thin functional copper foil and the subjacent dielectric layer. It follows that "half etching" or "conformal mask building" steps are no longer necessary, so that the manufacturing process of a multilayer PCB gets simpler. The simplicity of the process enables high speed processing and high productivity, with less process equipment and therefore lower investment costs. In other words, the process of manufacturing gets more efficient. Consumption of chemical etching agents is also substantially reduced. This is of course an important feature with regard to environmental protection. With regard to quality control, it will be noted that the thin functional copper foil has an accurate thickness and a controlled and homogenous surface profile and roughness, so that the $CO_2$ laser beam encounters similar and reproducible drilling conditions everywhere. It follows that the laser energy can be set to drill very precise microvias everywhere on the PCB, i.e. microvias having a well determined shape, diameter and height, without producing copper splashes on the copper surface. It will further be appreciated that the carrier provides the necessary rigidity for handling the functional resin coated copper foil. Moreover, the latter is protected between its carrier and its resin coating against particles, chemical agents or atmospheric agents, that may damage the surface integrity, and alter the future circuit pattern. Due to the self supporting carrier foil, not only the very thin functional copper foil, but also the rather brittle resin coating is protected against tears, cracks and wrinkles. During lamination, the carrier provides an efficient protection of the very thin functional copper foil against dust and particles (as e.g. resin particles), which may indent the surface, and against resin bleed-through. After removal of the carrier, the functional copper layer is consequently clean and free of any defects such as e.g. indentations, tears, cracks and wrinkles.

The functional copper foil is preferably obtained by electro-deposition. Advantageously, the front side of the functional copper foil has received a surface preparation favouring the absorption of $CO_2$ laser light. Such a surface preparation may e.g. provide a front side having a particular surface profile and roughness and/or a colour favouring the absorption of $CO_2$ laser light. It can take place during manufacturing of the composite copper foil, so that the functional copper foil is ready for laser drilling after removal of its carrier. The front side of the functional copper foil may also be covered prior to laser drilling with a black oxide conversion coating, thus favouring the absorption of $CO_2$ laser light.

It will be noted that the composite foil preferably includes a release layer intermediate the carrier foil and the functional copper foil. Such a release layer may simply permit the separation of the carrier foil, like e.g. a thin, chromium based release layer. In this case, the, carrier removal then normally consists in mechanically peeling off the carrier foil and the release layer simultaneously, i.e. the release layer remains bonded to the carrier foil. However, another kind of release layer may remain on the functional copper foil instead of the carrier foil when removing the carrier foil, and exhibit a particular surface colour favouring the absorption of $CO_2$ laser light. Such a kind of release layer, having a dual function, may be a dark coloured conductive material layer and should allow copper electroplating to form the functional copper foil thereon, show a strong adhesion to the functional copper foil, and have a colour favouring the absorption of the infrared light of a $CO_2$ laser.

In a first embodiment, the resin is a B-staged resin. It can therefore adapt to the subjacent circuits of the core board, and the polymerisation is completed during lamination.

In a second embodiment, the resin coating on the back side consists of a C-staged resin layer applied to the back side of the functional copper foil, and of a B-staged resin layer applied to said C-staged resin layer. The insulating layer is therefore thicker and can still adapt to the subjacent circuit layer.

It will be appreciated that the present invention also provides a composite foil for use in a method for manufacturing a multilayer printed circuit board, comprising a self-supporting carrier foil, preferably a copper foil with a thickness from 18 to 150 μm; a release layer on one side of the carrier foil; a functional copper foil, having a thickness of less than 10 μm, most preferably of about 5 μm, the functional copper foil being deposited on the release layer and having a front side facing the release layer and a back side; and a nonreinforced thermosetting resin coating on the back side of the functional copper foil.

The front side of the functional copper foil has preferably received a surface preparation favouring the absorption of $CO_2$ laser light. Such a surface preparation may be carried out by forming a dark coloured conductive material layer between the release layer and the functional copper foil. In a first embodiment of the composite copper foil of the invention, the dark coloured conductive material layer may comprise carbon black and/or graphite. In a second embodiment, the dark coloured conductive material layer may comprise a dark coloured electrically conductive polymer layer.

It shall be noted that the release layer may itself be a dark coloured conductive material layer, thereby exhibiting a dual function of release layer and surface preparation favouring the absorption of $CO_2$ laser light. The composite foil would then comprise a carrier foil, this release layer having a dual function, a functional copper foil, and a resin coating. It is clear that such a release layer, contrary to a conventional release layer like e.g. a chromium release layer, has to adhere to the front side of the functional copper foil when removing the carrier foil.

Advantageously, the back side of the functional copper foil has a bonding layer thereon so as to improve its bond strength with the resin coating. Moreover, the functional copper foil may be covered with a passivation layer, preferably intermediate the bonding layer and the resin coating, in order to warrant the stability of the, back side.

BRIEF DESCRIPTION OF THE DRAWINGS

The present invention will be more apparent from the following description of a not limiting embodiment with reference to the attached drawings, wherein.

DETAILED DESCRIPTION OF THE PREFERRED EMBODIMENT

Figure 1:
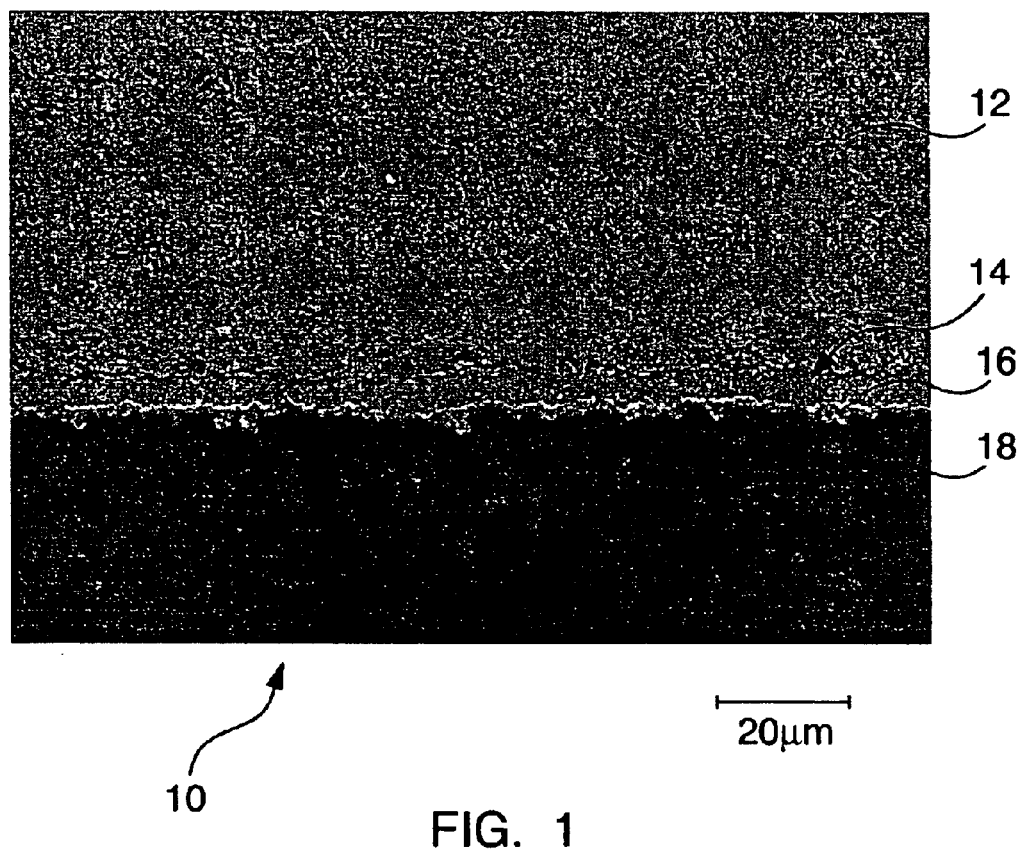
FIG. 1: is a cross-sectional S.E.M.-view of a composite foil used for the manufacturing of a multilayer printed circuit board.

The present method uses a composite foil 10, more precisely a resin-coated carrier-mounted copper foil for building a multilayer PCB. FIG. 1 shows a Scanning Electron Microscope view: of such a composite foil, which will be laminated on a core board. It comprises four different layers: a carrier foil 12; a release layer 14; a functional copper foil 16; and a resin coating 18. Such a composite foil is the result of two subsequent manufacturing processes.

The first process is similar to the process described in U.S. Pat. No. 3,998,601. First, a 70 μm carrier foil 12 is produced from an acid based electrolyte by continuous electrodeposition on a rotating titanium drum that has a precisely engineered surface. The drum surface topography prescribes and controls the initial layer of copper deposited. The topography of the other side, the matte side, of the carrier layer is controlled by the additives in the basic drum copper electrolyte. In a further step the release layer 14 is applied to one surface of the carrier foil 12, providing very closely controlled, but relatively low adhesion characteristics. The release layer 14 has a very thin thickness, typically less than 1 μm. The functional copper foil 16 is electrodeposited onto the release layer 14 with a thickness of preferably 5 μm. The side of the functional copper foil 16 facing the carrier foil 12, called hereinafter the front side, is consequently a mirror image of the surface of the carrier foil 12 which is covered with the release layer 14. It follows that acting on the structure of the surface of the carrier foil 12 which is covered with the release layer 14 enables to provide a particular surface profile and roughness to said front side of the functional copper foil 16. The other side of the functional copper foil 16, hereinafter called the back side, is a matte side. This back side undergoes a series of chemical and electrochemical treatments, that will define some functional characteristics, such as bond strength with regard to the resin coating and stability with regard to corrosion. Hence a bonding layer, obtained by electrodeposition of copper nodules, is formed on the back side of the functional copper. Then a passivation layer is applied over the bonding layer. It may be noted that a passivation layer may also be applied over the exposed side of the carrier foil 12, i.e. not bearing the release layer 14, in order to avoid the formation of a "blue oxidation frame" during PCB manufacturing, e.g. in a press.

In the following process, the composite copper foil 12, 14, 16 is processed in a coating machine, where the back side of the functional copper foil 16, already covered by the bonding layer and the passivation layer (not shown on the Figures), is coated with a non-reinforced thermosetting preferably semi-polymerised (B-staged or semi-cured) resin. The use of a B-staged resin is very convenient when the composite foil is laminated on a core board. Indeed, since the resin is only semi-polymerised, it can adapt to the subjacent topography of the outer layer circuits of the core board. On top of that, the polymerisation of the B-staged resin can be finished (leading to C-staged resin) during lamination since it is e.g. carried out in a hydraulic press or in an autoclave with heating and cooling cycles.

The resinous coating 18 may also comprise two superimposed layers. One first thin layer (25–45 μm) of C-staged resin is applied on the functional copper layer, and a second layer of semi-cured resin is applied over the precedent one. This way of processing achieves a thick resinous coating and is much easier and safer than applying a single layer of B-staged resin having the same thickness. It is of course also possible to apply more than two resin layers in order to reach the desired thickness.

Figure 2:
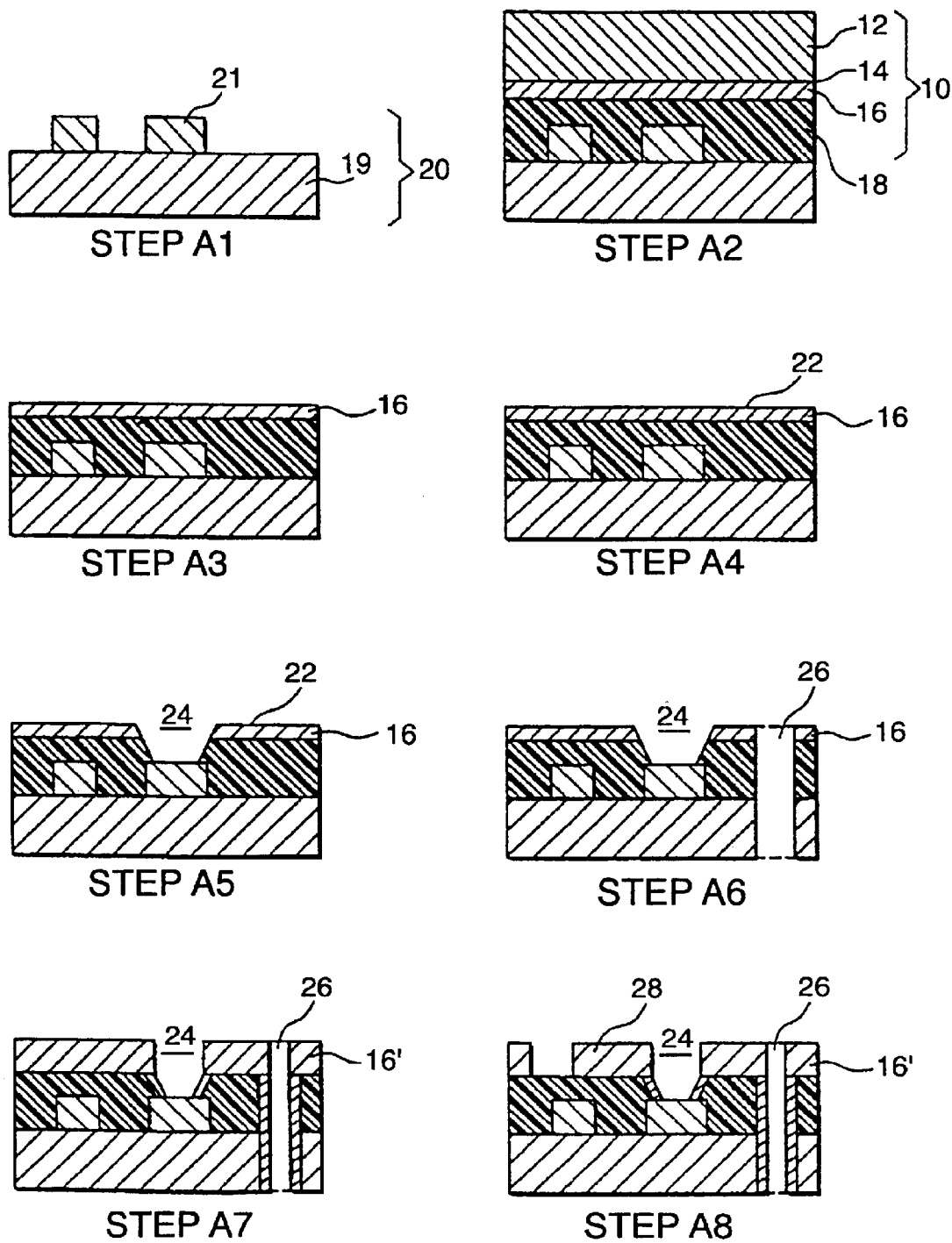
FIG. 2: is a diagram showing the process steps of the manufacturing of a multilayer printed circuit board.

FIG. 2 illustrates a preferred manufacturing process of a multilayer printed circuit board in accordance with the present invention.

The process starts in step A1 with the provision of a finished core board 20. The core board 20 shown in FIG. 2 consists e.g. of a one-sided copper-cladded prepreg 19, where circuit patterns 21 have already been etched into the copper clad. The circuit patterns 21 are preferably surface treated by oxidation or roughening, in order to achieve a higher bonding strength with the subsequent overlying dielectric material.

In step A2, a composite foil 10, obtained as described hereinbefore, is laminated on one side of the core board 20, wherein the resin coating 18 of the composite foil 10 faces the circuit patterns 21 on the core board 20. This lamination takes place in a hydraulic press and involves preferably several cooling and heating cycles. During the lamination step, the polymerisation of the B-staged thermosetting resin is completed. It shall be remarked that a greater dielectric thickness can be obtained by placing an interlaminar dielectric sheet between the core board 20 and the composite foil 10 before lamination.

Once the lamination is finished and the resin 18 is fully polymerised, step A3 takes place, i.e. the carrier foil 12 and the release layer 14 are mechanically peeled off. The very thin release layer 14 remains bonded to the 70 μm copper carrier foil 12, leaving an atomically clean, homogeneous and defect free functional copper layer 16 on top of the core board 20.

In step A4, the functional copper foil 16 preferably undergoes a surface treatment, in order to prepare its front side for direct $CO_2$ laser drilling. This surface treatment may consist in the deposition of a black oxide conversion coating 22 on the functional copper foil 16. The black oxide conversion coating warrants indeed an efficient $CO_2$ laser drilling, because it reduces laser light reflection on the uncovered copper surface. It will be understood the black oxide conversion coating may be replaced by any laser drilling adapted oxide conversion coating, such as for example a brown oxide conversion coating.

Step A5 consists in drilling micro blind vias 24 into the functional copper foil 16 and the resin layer 18, so as to reach underlying copper pads, for future interconnection of the functional copper foil 16 and the circuit patterns 21 on the core board 20. It will be appreciated that the microvias are drilled directly with a $CO_2$ laser source in one step through the functional copper foil 16 and the resin coating 18. $CO_2$ laser sources emit light in the infrared range with a wavelength between 9.4 and 10.6 μm. Such infrared wave lengths are not well suited for copper ablation, but—due to its small thickness and its specific surface treatment—the functional copper foil 16 is nevertheless pierced without difficulties by the $CO_2$ laser beam. Once the very thin copper layer is removed, the $CO_2$ laser fully develops its advantages. Over 90% of the laser radiation is then absorbed by the underlying dielectric material, up to a depth which is several times the wavelength. This results in very high ablation rates per laser pulse and therefore a high drilling speed. It remains to be said that material ablation with a $CO_2$ laser is based on a photothermal process. The laser radiation is absorbed by the material to be removed, which is vaporised and driven out of the interaction zone through a resulting overpressure. Once the lower target pad is uncovered, the laser radiation is almost completely reflected by this target pad and material removal is thereby stopped automatically.

Next, in step A6, through-holes 26 are mechanically drilled into the PCB. It shall be noted that this step is optional, as will be explained later.

Step A7 is a combination of four sub-steps:
the PCB is firstly cleaned with high pressure water;
the PCB subsequently undergoes a complete removal of the black oxide conversion coating and a desmearing process which warrants the removal of all the residues from the $CO_2$ laser ablation;
then copper is firstly deposited by electroless plating in the microvias, the through holes and over the whole PCB.
finally galvanic reinforcement, i.e. copper electrodeposition, is preferably carried out until the outer copper layer 16' reaches e.g. a thickness of about 18 μm.

During step A8, the outer copper layer 16', which has now a thickness of preferably 18 μm, is etched in order to form circuit patterns 28 on the outer surface. The Circuit patterns may be etched during step A7 before the electroless plating and galvanic reinforcement, the method subsequently finishing at the end of step A7.

It should be noted that step A4 (i.e. deposition of the black oxide conversion coating) of the process of FIG. 2 can be suppressed, when using a composite foil having a functional copper foil, the front side of which is prepared for laser drilling during manufacturing. Indeed, the front side is typically a shiny side which reflects the $CO_2$ laser beam; the black oxide conversion coating avoids such reflection, thus causing the $CO_2$ laser beam to heat the copper surface, enabling material ablation. Another way of avoiding reflection of the $CO_2$ laser beam is to obtain, during the manufacturing of the composite foil, a non-reflecting front side. The front side can be characterised by its colour and its matteness. In that respect, the front side characteristics should be prepared in order to provide a surface profile and roughness favouring the absorption of $CO_2$ laser light. The front side should also undergo a surface preparation so as to form a front side having a colour favouring the absorption of $CO_2$ laser light.

Such a surface preparation taking place during manufacturing comprises for example the step of providing a thin layer of dark coloured electrically conductive material on the release layer before electrodepositing the functional copper foil. When the carrier foil and the release layer are peeled-off, the thin layer of dark coloured electrically conductive material adheres to the front side of the functional copper foil and thereby provides a dark coloured layer on this front side. It will be noted that such a thin layer of dark coloured electrically conductive material must adhere to the release layer, allow copper electroplating to form the functional copper foil thereon, show a stronger adhesion to the functional copper foil than to the release layer, and have a colour favouring the absorption of the infrared light of a $CO_2$ laser.

Besides, it will be understood that such a thin layer of dark coloured electrically conductive material may play the role of release layer itself and of course that of the surface preparation favouring the absorption of $CO_2$ laser light. Thus, the composite foil would comprise a carrier foil, a release layer of dark coloured electrically conductive material, a functional copper foil and a resin coating. It is clear that the release layer should then necessary remain on the front side of the functional copper foil when peeling off the carrier foil.

A first candidate for forming such a dark coloured electrically conductive material layer is carbon. A substantially continuous layer of carbon can be obtained by carbon deposition. Carbon deposition may comprise the application of a liquid carbon dispersion to the side of carrier foil, possibly covered with a chromium based release layer, which will be facing the functional copper foil. Generally, the carbon dispersion contains three principal ingredients, namely carbon, one or more surfactants capable of dispersing the carbon, and a liquid dispersing medium such as water. Many types of carbon may be used including the commonly available carbon blacks, furnace blacks, and suitable small particle graphites. The average particle diameter of the carbon particles, should be as small as possible to obtain even plating. The carbon particles may be treated before or after deposition in order to enhance or improve the electroplating. Therefore, the carbon particles can be treated with particular dyes, particular conductive metals, or chemically oxidised.

Example: in order to produce a composite copper foil having a functional copper foil with a front side prepared for laser drilling, there was provided a 35 μm thick carrier foil made of copper. A chromium release layer was conventionally (as described in U.S. Pat. No. 3,998,601) electrodeposited on one side of the carrier foil. Then, as explained above, a thin (15–25 µm), conductive layer containing carbon black and/or graphite, i.e. the dark coloured electrically conductive material layer, was formed onto the chromium plated side of the carrier foil. The carbon paste was Carbon-Leitlack SD 2841 HAL-IR (Lackwerke Peters, D-47906 Kempen). The carbon layer was dried by use of infrared light, and a 5 µm thick functional copper foil was subsequently electrodeposited on the carbon coated side of the carrier foil. The electrodeposition of the functional copper foil was carried out in an electroplating bath comprising 60 to 65 g/l of copper sulfate (as $Cu^{2+}$) and 60 to 65 g/l of sulfuric acid. The current density was 11 $A/dm^2$ and the temperature of the electroplating bath was 60° C. Next, a nodular treatment was applied to the outer side of the functional copper foil. This foil was subsequently laminated on a conventional glass-epoxy FR4 prepreg (Duraver-E-104 from Isola werke AG, D-52348 Duren) at 175° C. for 80 minutes using a pressure of 20–25 bar. After cooling down to room temperature, the carrier foil was manually peeled off. As a result, there was obtained a black coating on the 5 µm thick, functional copper foil, which required no further surface preparation before $CO_2$ laser drilling.

A second candidate for forming the dark coloured electrically conductive material layer is a dark coloured electrically conductive polymer. Indeed, some monomers, such as pyrrole, furan, thiophene and some of their derivatives, and namely functionalised monomers, are capable of being oxidised into polymers that are electrically conductive. Such a monomer is preferably applied to the surface of the release layer by a wet process, i.e. in a liquid or aerosol form. The monomer is thereafter polymerised, and the functional copper foil is subsequently deposited over the polymer layer. It will be understood that, when applied to the side of the carrier foil, possibly covered with a release layer, that will be facing the functional copper foil, the monomer can be part of a precipitation solution also containing at least a solvent. The precipitation solution might also contain one additive increasing the darkness of the polymerised monomer.

If the composite foil has a chromium based release layer and a dark coloured electrically conductive material layer, then the release layer may be treated during manufacturing of the composite foil to avoid a too strong adhesion of the carbon layer or the dark coloured electrically conductive polymer layer thereon. The adherence of those layers to the front side of the functional copper foil is thereby ensured, which is desirable when the carrier foil and the release layer are peeled off at step A3.

It shall be noted that the method presented herein has been described for a single sided core board, but is also applicable with a double-sided core board, the different steps being subsequently performed on both surfaces. The composite foil 10 could also comprise a 35 µm carrier foil 12 instead of a 70 µm carrier foil 12.

It remains to be noted that a PCB generally comprises several outer layers. Hence, the PCB of step A8 may serve as core board in the above described manufacturing method, so as to add outer layers thereon. However, it will be understood that step A6 is not necessary to pass from step A5 to step A7, and was therefore termed optional. Indeed, the mechanical through hole drilling—when required—generally only occurs when manufacturing the very last outerlayer of the PCB. In other words, the PCB obtained at step A8 after a first run of the manufacturing method may not have a mechanically drilled through hole. It is also clear that, for the first run of the process, the core board 20 at step A1 may already be a one-sided or double-sided PCB consisting of several layers.

A last remark concerns the formation of the functional copper foil. In the present description, the functional copper foil 16 was electrodeposited on the release layer or on the dark coloured electrically conductive material layer. The functional copper foil could also be formed independently— e.g. by electrodeposition—and then placed over the release layer or dark coloured electrically conductive material layer. Another alternative, however onerous, is to start the formation of the thin functional foil on the release layer or dark coloured electrically conductive material layer with a CVD or PVD process, and to subsequently grow the obtained copper layer to the desired thickness by galvanic reinforcement.

What is claimed is:

1. A method for manufacturing a multilayer printed circuit board comprising the following steps:
   a) providing a core board;
   b) providing a composite foil including a carrier foil, a functional copper foil and a non-reinforced thermosetting resin layer, wherein said functional copper foil is electro-deposited with a uniform thickness of more than 4 µm but less than 10 µm on said carrier foil, said functional copper foil having a front side facing said carrier foil and an opposite backside, and said backside being coated with said non-reinforced thermosetting resin layer;
   c) laminating said composite foil with said non-reinforced thermosetting resin layer on said core board;
   d) removing said carrier foil from said functional copper foil in order to uncover said front side of said functional copper foil; and
   e) using a $CO_2$ laser source to drill holes from said uncovered front side of said functional copper foil through said functional copper foil and said non-reinforced thermosetting resin layer in order to form microvias.

2. The method of claim 1, wherein said functional copper foil is electro-deposited with a uniform thickness of about 5 µm.

3. The method of claim 1, wherein said front side of said functional copper foil has received a surface preparation favoring the absorption Of $CO_2$ laser light.

4. The method of claim 3, wherein said surface preparation provides a particular surface color favoring the absorption Of $CO_2$ laser light.

5. The method of claim 3, wherein said surface preparation of said front side takes place during manufacturing of said composite foil.

6. The method of claim 3, wherein said surface preparation provides a particular surface profile and roughness favoring the absorption of $CO_2$ laser light.

7. The method of claim 1, wherein said front side of said functional copper foil is covered with a black oxide conversion coating prior to laser drilling.

8. The method of claim 1, wherein:
   said composite foil further includes a release layer intermediate said carrier foil and said functional copper foil; and
   said carrier foil removal of step d) consists in mechanically peeling off said carrier foil and said release layer simultaneously.

9. The method of claim 1, wherein:
   said composite foil further includes a release layer intermediate said carrier foil and said functional copper foil;
   said release layer having a particular surface colour favouring the absorption Of $CO_2$ laser light; and when removing said carrier foil at step d), said release layer remains on said front side of said functional copper foil.

10. The method of claim 1, wherein said resin comprises a layer of B-staged resin.

11. The method of claim 1, wherein said resin layer comprises a C-staged resin layer applied on said back side of said functional copper foil, and a B-staged resin layer applied on said C-staged resin layer.

12. The method of claim 1, wherein after step e), copper is deposited by electroless plating over said functional copper foil.

13. The method of claim 12, wherein after electroless plating, copper is electro-deposited over said functional copper foil in order to increase its thickness.

14. The method of claim 1, wherein after removal of said carrier foil, said front side of said functional foil has a particular surface profile and roughness favouring the absorption of $CO_2$ laser light.

15. The method of claim 1, wherein after removal of said carrier foil, said front side of said functional foil has a particular surface colour favouring the absorption of $CO_2$ laser light.

16. The method of claim 1, wherein said composite foil further includes:
   a release layer intermediate said carrier foil and said functional copper foil, said release layer remaining on said carrier foil when the latter is removed at step d); and
   a thin layer of dark coloured electrically conductive material between said release layer and said functional copper foil, said thin layer of dark coloured electrically conductive material remaining on said front side of said functional foil when said carrier foil is removed at step d).

17. The method of claim 16, wherein:
   said carrier foil has a thickness between 18 $\mu$m and 150 $\mu$m;
   said re-lease layer has a thickness of less than 1 $\mu$m; and
   said resin coating has a thickness between 5 $\mu$m and 150 $\mu$m.

18. The method of claim 16, wherein said release layer is a chromium based layer.

19. The method of claim 16, wherein said thin layer of dark coloured electrically conductive material is a layer comprising carbon black and/or graphite.

20. The method off claim 16, wherein said thin layer of dark coloured electrically conductive material is a layer comprising a dark coloured electrically conductive polymer.

21. The method of claim 1, wherein said composite foil further includes a bonding layer on said back side of said functional copper foil under said nonreinforced thermosetting resin layer.

22. The method of claim 21, wherein said composite foil further includes a passivation layer on said back side of said functional copper foil, intermediate said bonding layer and said non-reinforced thermosetting resin layer.

* * * * *